(12) United States Patent
Choi (10) Patent No.: US 8,107,284 B2
(45) Date of Patent: Jan. 31, 2012

(54) NONVOLATILE MEMORY DEVICE USING A VARIABLE RESISTIVE ELEMENT

(75) Inventor: Byung-Gil Choi, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 239 days.

(21) Appl. No.: 12/630,317

(22) Filed: Dec. 3, 2009

(65) Prior Publication Data

US 2010/0142249 A1 Jun. 10, 2010

(30) Foreign Application Priority Data

Dec. 5, 2008 (KR) .................. 10-2008-0123279

(51) Int. Cl.
*G11C 11/00* (2006.01)
(52) U.S. Cl. ...................... 365/163; 365/148
(58) Field of Classification Search .............. 365/148, 365/163
See application file for complete search history.

(56) References Cited

U.S. PATENT DOCUMENTS 5,828,594 A * 10/1998 Fujii .............................. 365/63
2005/0185445 A1* 8/2005 Osada et al. .................. 365/148

FOREIGN PATENT DOCUMENTS

| JP | 2006-202383 | 8/2006 |
| KR | 1020060022009 | 3/2006 |
| KR | 100587694 | 6/2006 |
| KR | 100827706 | 4/2008 |

* cited by examiner

*Primary Examiner* — Anh Phung
(74) *Attorney, Agent, or Firm* — F. Chau & Associates, LLC (57) ABSTRACT

A nonvolatile memory device includes a plurality of memory banks, each including a plurality of nonvolatile memory cells, write global bit lines shared by the plurality of memory banks, read global bit lines shared by the plurality of memory banks, and a dummy global bit line arranged between the write global bit lines and the read global bit lines, wherein the dummy global bit line is configured and operable to reduce noise affecting a write bit line involved in a write operation or noise affecting a read global bit line involved in a read operation.

14 Claims, 6 Drawing Sheets

FIG. 11 ated resistance changes in metal oxides, and magnetic random access memory (MRAM), which utilizes magnetic tunnel junction (MTJ) thin films whose resistance changes according to a magnetization state of a ferromagnetic substance. A resistance value is maintained in these devices even when no current or voltage is supplied, thereby demonstrating nonvolatile memory characteristics.

NONVOLATILE MEMORY DEVICE USING A VARIABLE RESISTIVE ELEMENT

CROSS-REFERENCE TO RELATED APPLICATION

This application claims priority under 35 U.S.C. §119 to Korean Patent Application No. 10-2008-0123279 filed on Dec. 5, 2008 in the Korean Intellectual Property Office, the disclosure of which is incorporated by reference herein in its entirety.

BACKGROUND

1. Technical Field

The present inventive concept relates to a nonvolatile memory device using a variable resistive element.

2. Discussion of the Related Art

Nonvolatile memory device types include, for example, phase change random access memory (PRAM), which utilizes a phase-change material such as a chalcogenide alloy that can be switched between two states, resistance random access memory (RRAM), which takes advantage of controll- For example, the phase-change material of a PRAM becomes crystalline or amorphous as it is cooled after being heated. The phase-change material has low resistance in the crystalline state and high resistance in the amorphous state. Therefore, the crystalline state may be defined as set data or data 0, and the amorphous state may be defined as reset data or data 1. However, noise during write and/or read operations may cause errors in data written to or read from a PRAM cell.

Accordingly, there exists a need to prevent write and/or read data errors from occurring in a nonvolatile memory device.

SUMMARY

The present inventive concept provides a nonvolatile memory device, which can reduce noise affecting write global bit lines during a write operation and noise affecting read global bit lines during a read operation by discharging parasitic capacitances, thereby improving performance in write and/or read operations.

According to an exemplary embodiment of the present inventive concept, there is provided a nonvolatile memory device including a plurality of memory banks, each including a plurality of nonvolatile memory cells, write global bit lines shared by the plurality of memory banks, read global bit lines shared by the plurality of memory banks, and a dummy global bit line arranged between the write global bit lines and the read global bit lines, wherein the dummy global bit line is configured and operable to reduce noise affecting a write global bit line involved in a write operation or noise affecting a read global bit line involved in a read operation.

The nonvolatile memory device further comprises a ground line shared by the plurality of memory banks and disposed between the write global bit lines and the dummy global bit line.

The ground line is coupled to the write global bit lines through a first discharge block, and the read global bit lines and the dummy global bit line through a second discharge block.

The dummy global bit line and the read global bit lines are simultaneously discharged through the ground line.

The nonvolatile memory device further comprises a ground line shared by the plurality of memory banks and disposed between the read global bit lines and the dummy global bit line.

The ground line is coupled to the write global bit lines and the dummy global bit line through a first discharge block, and the read global bit lines through a second discharge block.

The dummy global bit line and the write global bit lines are simultaneously discharged through the ground line.

When a read global bit line is selected for reading, unselected read global bit lines and the dummy global bit lines go into a floating state.

Data is readable from a nonvolatile memory cell in a second memory bank through a first read global bit line, while data is being written in a nonvolatile memory cell in a first memory bank through a first write global bit line.

The first write global bit line and the first read global bit line are selectively coupled to the same nonvolatile memory cell.

The nonvolatile memory device further includes a ground line, and the ground line is disposed between the word global bit lines and the dummy global bit line.

A nonvolatile memory cell comprises a phase change nonvolatile memory cell.

The phase change nonvolatile memory cell comprises a diode controlled phase change random access memory cell.

The nonvolatile memory device is connected to a memory controller, a host processing system or a central processing unit.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept are described more fully hereinafter with reference to the accompanying drawings. The present inventive concept may, however, be embodied in many different forms and should not be construed as being limited to the exemplary embodiments set forth herein.

It will be understood that when an element is referred to as being "connected to" or "coupled to" another element, it can be directly connected or coupled to the other element or intervening elements may be present.

Hereinafter, a description will be made of exemplary embodiments of the present inventive concept by using phase change random access memory (PRAM) devices. However, it will be understood by those skilled in the art that the present inventive concept can be applied to various types of nonvolatile memory devices that use resistance materials, for example, resistive random access memory (RRAM) devices, ferroelectric random access memory (FRAM) devices, and magnetic random access memory (MRAM) devices.

Figure 1:
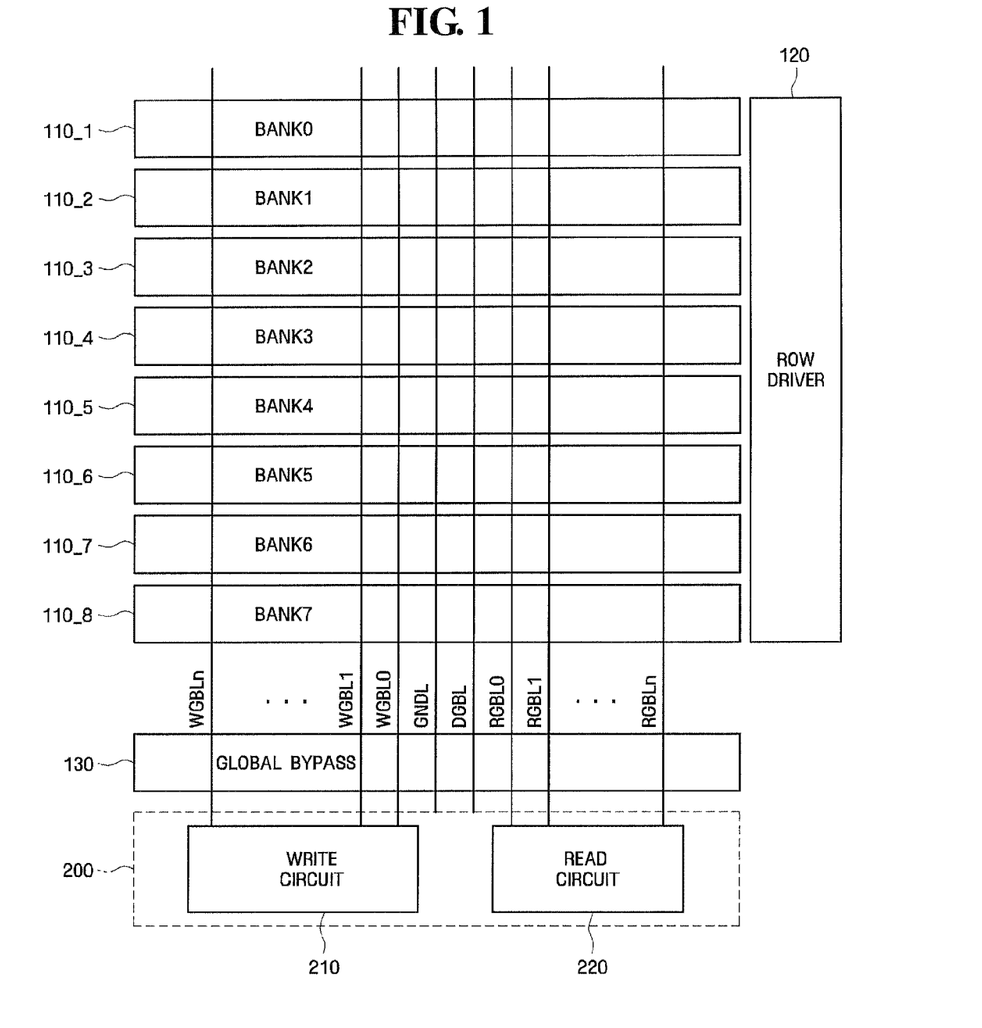
FIG. 1 is a block diagram illustrating a nonvolatile memory device according to an exemplary embodiment of the present inventive concept.
Figure 2:
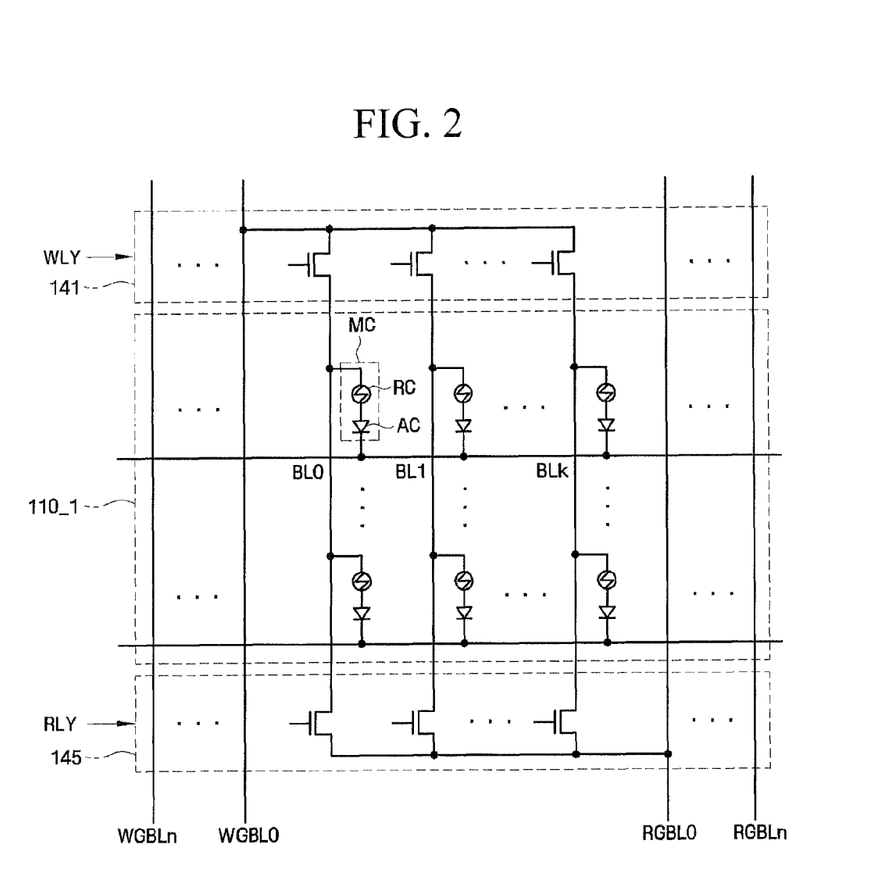
FIG. 2 is a circuit diagram of a memory bank shown in FIG. 1.
Figure 3:
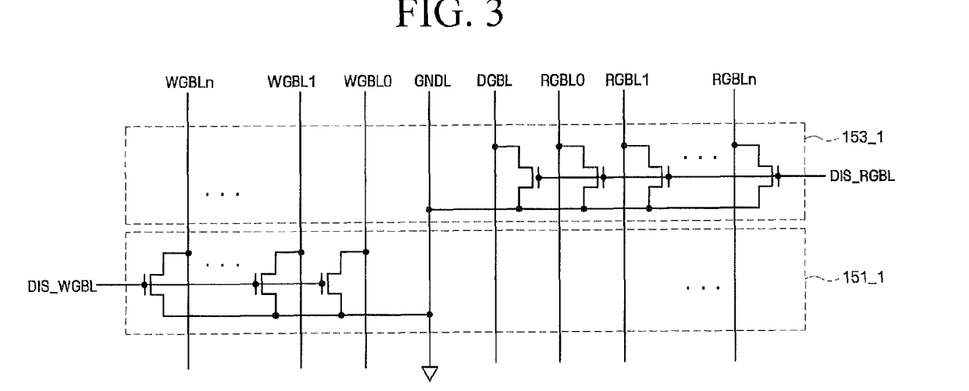
FIG. 3 is a layout diagram for explaining write global bit lines, a ground line, a dummy global bit line and read global bit lines shown in FIG. 1.

FIG. 1 is a block diagram illustrating a nonvolatile memory device according to an exemplary embodiment of the present inventive concept, FIG. 2 is a circuit diagram of a memory bank shown in FIG. 1, and FIG. 3 is a layout diagram for explaining write global bit lines, a ground line, a dummy global bit line and read global bit lines shown in FIG. 1.

In the exemplary embodiment shown in FIG. 1, a memory cell array having eight (8) memory banks is illustrated for the sake of simplicity. However, the present inventive concept is not limited to only this array, for example, the number of memory banks may vary according to a design specification. For the sake of descriptive simplicity, in FIG. 2, the ground line and dummy global bit line shown in FIG. 1 are not illustrated. In addition, for the sake of descriptive simplicity, while only a nonvolatile memory cell coupled to a first write global bit line WGBL0 and a first read global bit line RGBL0 is illustrated in FIG. 2, the present inventive concept is not limited to only this coupling architecture, for example, a nonvolatile memory cell may be coupled to another write global bit line and another read global bit line in the same fashion.

Referring to FIGS. 1 and 2, the nonvolatile memory device according to the exemplary embodiment shown in FIG. 1 includes a plurality of memory banks 110_1 to 110_8, write global bit lines WGBL0 to WGBLn, a ground line GNDL, a dummy global bit line DGBL, read global bit lines RGBL0 to RGBLn, a row driver 120, a global bit line selection block 130 and an input/output circuit 200.

Each of the respective memory banks 110_1 to 110_8 includes an array of a plurality of nonvolatile memory cells MCs. Rows of the plurality of nonvolatile memory cells MCs are coupled to respective word lines WL0 to WLm, and columns of the plurality of nonvolatile memory cells MCs are coupled to bit lines.

The nonvolatile memory cells MC may include a phase change material RC whose resistance may vary according to its crystalline or amorphous state, and an access element AC that may control the current flowing through the phase change material RC. Here, a diode that is serially coupled to the phase change material RC, or a transistor may be used as the access element AC. In FIG. 2, a diode is used as the access element AC by way of example, but the present inventive concept is not limited thereto. A phase change nonvolatile memory cell utilizing a diode as an access element AC is referred to as a diode-controlled PRAM cell. In addition, the phase change material may include: a compound of two elements, such as GaSb, InSb, InSe, $Sb_2Te_3$, or GeTe; a compound of three elements, such as GeSbTe, GaSeTe, InSbTe, $SnSb_2Te_4$, or InSbGe; and a compound of four elements, such as AgInSbTe, GeSnSbTe, GeSbSeTe, or $Te_{81}Ge_{15}Sb_2S_2$. Among the above materials, GeSbTe, which is a compound of germanium (Ge), antimony (Sb), and tellurium (Te), may primarily be used as a phase change material.

Here, the nonvolatile memory cell MC may be constructed of a multi-level memory cell (MLC) in which the phase change material RC is set to a multi-level resistance state to store data of one or more bits.

The respective word lines WL0 to WLm are coupled to a plurality of nonvolatile memory cells MCs, and are arranged in the respective memory banks 110_1 to 110_8, unlike the global bit lines. Meanwhile, as nonvolatile memories have large capacity and are highly integratable, they may be implemented in a hierarchical word line structure using a main word line and a plurality of sub word lines. The row driver 120 adjusts voltage levels of the plurality of word lines WL0 to WLm, and at least one of the plurality of word lines WL0 to WLm may be selected accordingly.

In detail, the row driver 120 adjusts voltage levels of the plurality of word lines WL0 to WLm to, for example, a ground voltage level, in response to row addresses, to enable the word lines WL0 to WLm. Alternatively, the row driver 120 adjusts voltage levels of the plurality of word lines WL0 to WLm to, for example, a step-up supply voltage level, to disable the word lines WL0 to WLm.

As nonvolatile memories have large capacity and are highly integratable, bit lines may also be implemented in a hierarchical bit line structure using a global bit line and a plurality of local bit lines BL0 to BLk. In particular, in the nonvolatile memory device according to an exemplary embodiment of the present inventive concept, each global bit line may include write global bit lines WGBL0 to WGBLn and read global bit lines RGBL0 to RGBLn, as shown in FIG. 1.

The write global bit lines WGBL0 to WGBLn are arranged to be shared by the plurality of memory banks 110_1 to 110_8, to be used to write data in the plurality of memory banks 110_1 to 110_8. In detail, the write global bit lines WGBL0 to WGBLn selected by the global bit line selection block 130 are selectively coupled to the local bit lines BL0 to BLk by a write local bit line selection block 141 operating in response to a write local bit line selection signal WLY, to be used to write data in the nonvolatile memory cell MC selected by a write circuit 210.

Meanwhile, the read global bit lines RGBL0 to RGBLn are arranged to be shared by the plurality of memory banks 110_1 to 110_8, to be used to read data from the plurality of memory banks 110_1 to 110_8. In detail, the read global bit lines RGBL0 to RGBLn selected by the global bit line selection block 130 are selectively coupled to the local bit lines BL0 to BLk by a read local bit line selection block 145 operating in response to a read local bit line selection signal RLY, to be used to read data in the nonvolatile memory cell MC selected by a read circuit 220.

In the nonvolatile memory device according to an exemplary embodiment of the present inventive concept, the write global bit lines WGBL0 to WGBLn and read global bit lines RGBL0 to RGBLn are spaced apart from each other, as shown in FIG. 1.

When the global bit line of the nonvolatile memory device includes the write global bit lines WGBL0 to WGBLn and the read global bit lines RGBL0 to RGBLn, an area of a core structure may be reduced. In addition, when the write global bit lines WGBL0 to WGBLn and the read global bit lines RGBL0 to RGBLn of the nonvolatile memory device are spaced apart from each other, errors caused by parasitic capacitances between each of the write global bit lines WGBL0 to WGBLn and each of the read global bit lines RGBL0 to RGBLn may be reduced during a write operation and/or a read operation, compared to a case where the write global bit lines WGBL0 to WGBLn and the read global bit lines RGBL0 to RGBLn are alternately arranged, respectively.

In the exemplary embodiment shown in FIG. 2, the write local bit line selection block 141 is disposed above the respective memory banks 110_1 to 110_8 while the read local bit line selection block 145 is disposed below the respective memory banks 110_1 to 110_8. However, the present inventive concept is not limited thereto. For example, in an exemplary embodiment of the present inventive concept, the write local bit line selection block 141 may be disposed below the respective memory banks 110_1 to 110_8 while the read local bit line selection block 145 may be disposed above the respective memory banks 110_1 to 110_8. Although not shown, in a nonvolatile memory device according to an exemplary embodiment of the present inventive concept, a read global bit line selection block may be disposed at each of the memory banks, while at least two write global bit line selection blocks may be disposed at each of the memory banks, thereby facilitating a write operation.

The ground line GNDL is disposed between the plurality of write global bit lines WGBL0 to WGBLn and the plurality of read global bit lines RGBL0 to RGBLn, and reduces noises which may affect the write global bit lines WGBL0 to WGBLn and the read global bit lines RGBL0 to RGBLn during the write and read operations. In detail, since a relatively small voltage level change occurs in the ground line GNDL, which is coupled to the ground power supply, as compared to that in the write global bit lines WGBL0 to WGBLn and the read global bit lines RGBL0 to RGBLn, the noises caused by parasitic capacitances between the write global bit lines WGBL0 to WGBLn and the read global bit lines RGBL0 to RGBLn can be avoided. This will be described later with reference to FIG. 4.

At least one dummy global bit line DGBL is arranged between the ground line GNDL and the plurality of read global bit lines RGBL0 to RGBLn to reduce noises which may affect the write global bit lines WGBL0 to WGBLn and the read global bit lines RGBL0 to RGBLn during the write and read operations. In detail, the dummy global bit line DGBL can reduce noises affecting the write global bit lines WGBL0 to WGBLn and the read global bit lines RGBL0 to RGBLn during the write and read operations, the noises being caused by parasitic capacitances between the ground line GNDL and the read global bit lines RGBL0 to RGBLn as well as the noises affecting the write global bit lines WGBL0 to WGBLn and the read global bit lines RGBL0 to RGBLn, these noises being caused by parasitic capacitances between each of the write global bit lines WGBL0 to WGBLn and each of the read global bit lines RGBL0 to RGBLn.

Next, relationships between various lines will be described in detail. For example, the write global bit lines WGBL0 to WGBLn, the read global bit lines RGBL0 to RGBLn, the ground line GNDL, and the dummy global bit line DGBL may be arranged as shown in FIG. 3.

Referring to FIG. 3, in the nonvolatile memory device according to an exemplary embodiment of the present inventive concept, the plurality of write global bit lines WGBL0 to WGBLn, the ground line GNDL, the dummy global bit line DGBL and the plurality of read global bit lines RGBL0 to RGBLn are sequentially arranged, and the plurality of write global bit lines WGBL0 to WGBLn, the dummy global bit line DGBL and the plurality of read global bit lines RGBL0 to RGBLn are coupled to the ground line GNDL through first and second discharge blocks 151_1 and 153_1. In detail, the write global bit lines WGBL0 to WGBLn are coupled to the ground line GNDL through the first discharge block 151_1 to then discharge electric charges of the write global bit lines WGBL0 to WGBLn to the ground line GNDL in response to a first discharge signal DIS_WGBL. Meanwhile, the read global bit lines RGBL0 to RGBLn and the dummy global bit line DGBL are coupled to the ground line GNDL through the second discharge block 153_1 to discharge electric charges of the read global bit lines RGBL0 to RGBLn and the dummy global bit line DGBL to the ground line GNDL in response to a second discharge signal DIS_RGBL.

In FIG. 3, one dummy global bit line DGBL is shown, but the present inventive concept is not limited thereto. According to an exemplary embodiment of the present inventive concept, two or more dummy global bit lines DGBL may be disposed between the ground line GNDL and the plurality of read global bit lines RGBL0 to RGBLn.

The input/output circuit 200 is coupled to the write global bit lines WGBL0 to WGBLn to input data into the memory banks 110_1 to 110_8, and coupled to the read global bit lines RGBL0 to RGBLn to output data from the memory banks 110_1 to 110_8. The input/output circuit 200 includes the write circuit 210 and the read circuit 220.

The write circuit 210 is coupled to the write global bit lines WGBL0 to WGBLn to write data in the memory banks 110_1 to 110_8, and includes a data input buffer and a write driver. Here, the data input buffer receives external data and buffers write data to then supply the write data to the write driver. The write driver writes the write data supplied from the data input buffer in a nonvolatile memory cell MC selected among the memory banks 110_1 to 110_8.

The read circuit 220 is coupled to the read global bit lines RGBL0 to RGBLn to read data from the memory banks 110_1 to 110_8, and includes a sense amplifier and a data output buffer. The sense amplifier reads data from a nonvolatile memory cell MC selected among the memory banks 110_1 to 110_8. The data output buffer outputs the data read from the nonvolatile memory cell MC.

Hereinafter, the operation of a nonvolatile memory device according to an exemplary embodiment of the present inventive concept will be described in detail with reference to FIGS. 4 through 6.

Figure 4:
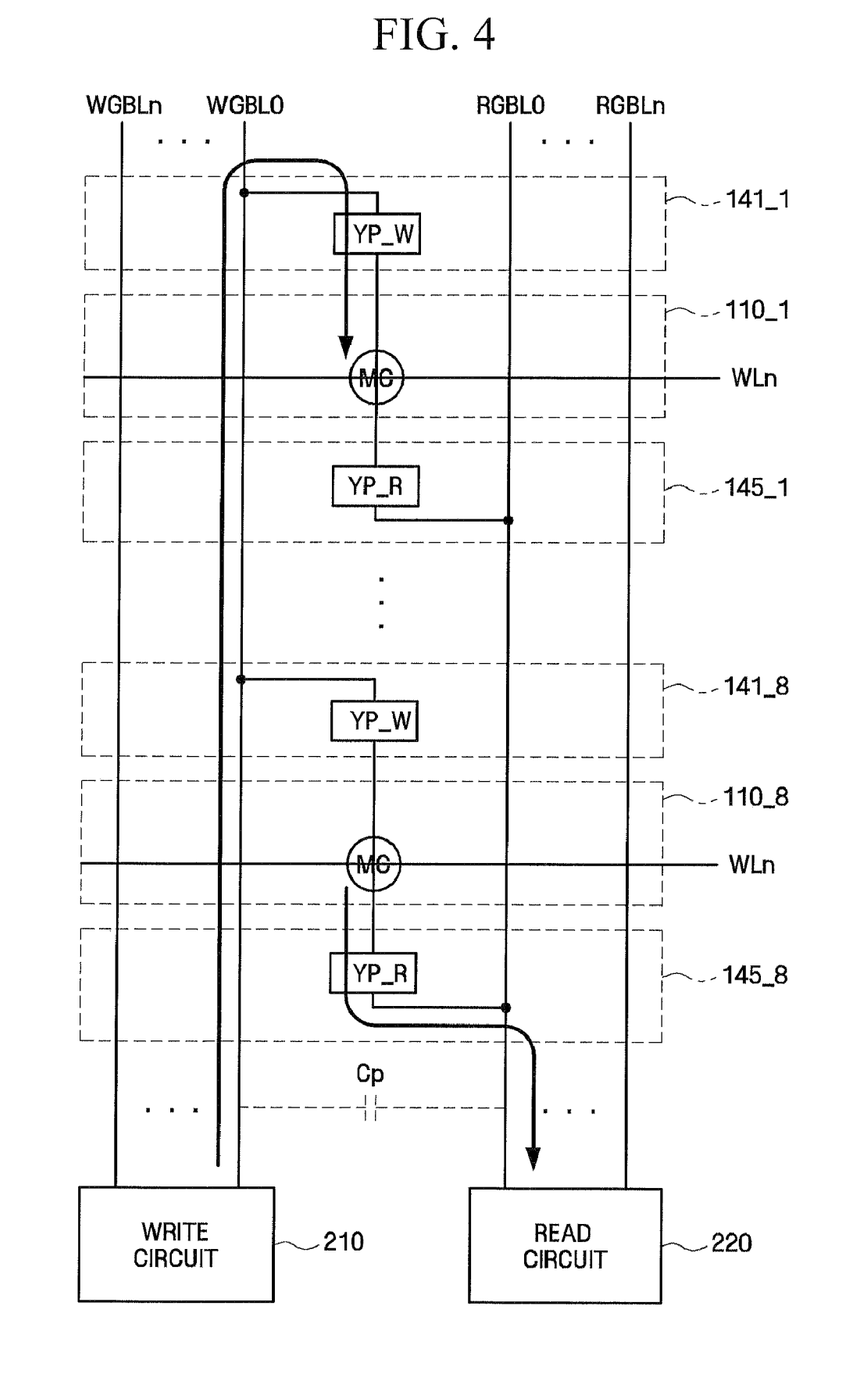
FIGS. 4 and 5 are diagrams for explaining the operation of a nonvolatile memory device according to an exemplary embodiment of the present inventive concept.
Figure 5:
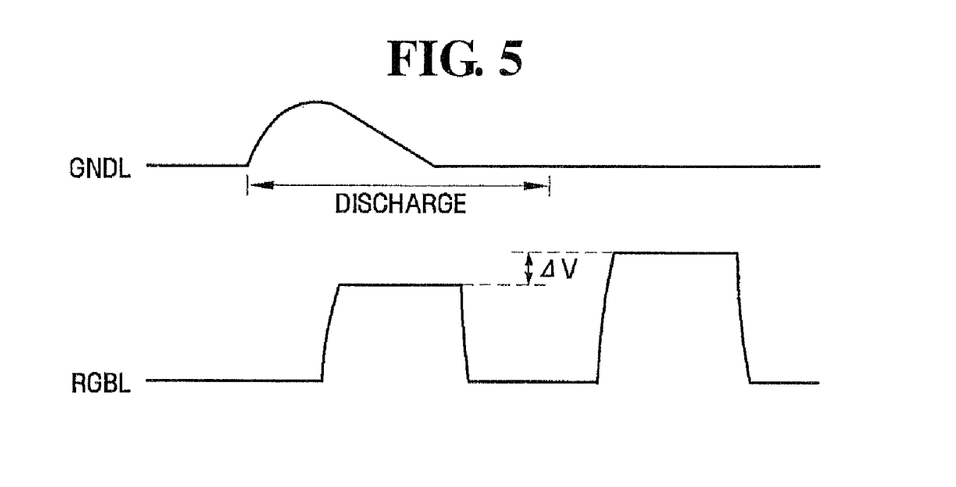

FIGS. 4 and 5 are diagrams for explaining the operation of a nonvolatile memory device according to an exemplary embodiment of the present inventive concept. FIG. 6 is a diagram for explaining a resistance distribution of a nonvolatile memory device according to an exemplary embodiment of the present inventive concept.

For the sake of descriptive simplicity, the first write global bit line WGBL0 and the first read global bit line RGBL0 are illustrated in FIG. 4 and a global bit line selection circuit is not shown. In addition, for the sake of descriptive simplicity, switches included in the write and read local bit line selection circuits shown in FIG. 2 are denoted by "YP_W" and "YP_R", respectively, in FIG. 4.

Figure 6:
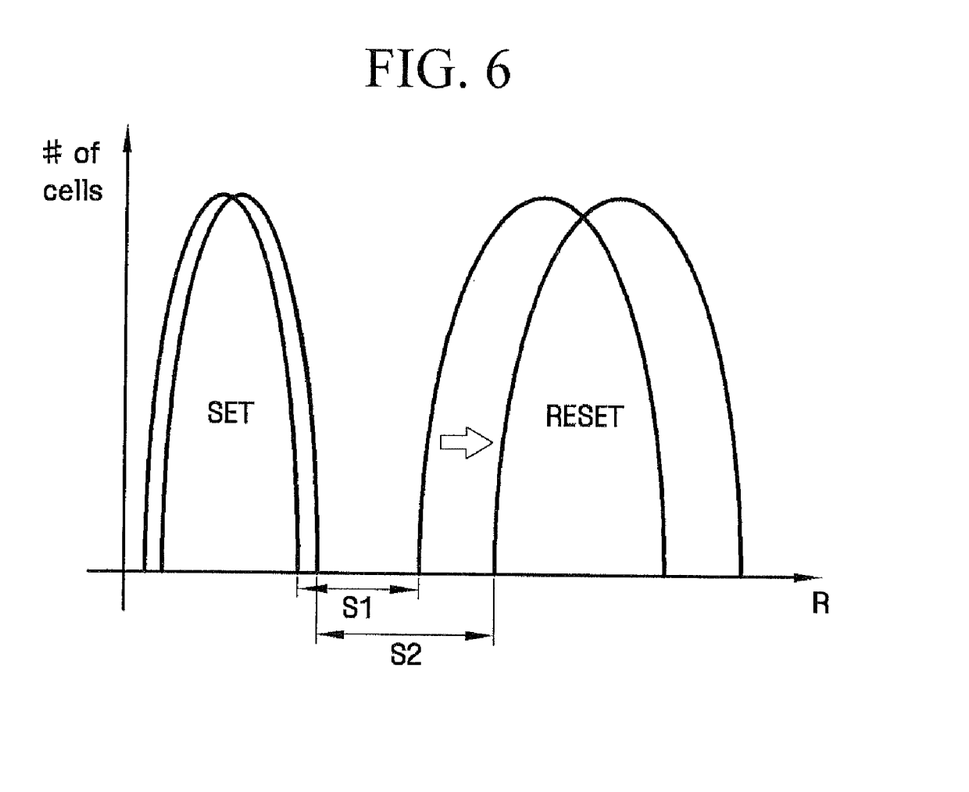
FIG. 6 is a diagram for explaining a resistance distribution of a nonvolatile memory device according to an exemplary embodiment of the present inventive concept.

Referring to FIGS. 4 to 6, the nonvolatile memory device according to an exemplary embodiment of the present inventive concept performs write and/or read operations in the respective memory banks 110_1 to 110_8. The write and/or read operations may be independently performed in different memory banks, rather than being simultaneously performed in the same memory banks. For example, the nonvolatile memory device may read data from a second memory bank (e.g., 110_8) through the read global bit line (e.g., RGBL0) while writing data in a first memory bank (e.g., 110_1) through the write global bit line (e.g., WGBL0) (in other words, enabling a read while write operation).

During the write and/or read operations, a word line (e.g., WLn) is first selected by the row driver 120 and a write global bit line (e.g., WGBL0) and a write local bit line are selected by a global bit line selection circuit (130 of FIG. 1) and write local bit line selection circuits 141_1 and 141_8 to select a nonvolatile memory cell MC in which data is to be written. Similarly, the word line (e.g., WLn) is selected by the row driver 120 and a read global bit line (e.g., RGBL0) and a read local bit line are selected by the global bit line selection circuit (130 of FIG. 1) and read local bit line selection circuits 145_1 and 145_8 to select a nonvolatile memory cell MC from which data is to be read. Here, when the nonvolatile memory cell MC is a diode-controlled PRAM cell, the selected word line WLn is adjusted to a ground voltage level, to turn on the diode. To write data in the first memory bank 110_1, the write circuit 210 supplies a write pulse to the write global bit lines WGBL0 to WGBLn using joule heat derived from a write current flowing through the nonvolatile memory cell MC. In detail, to write data of a first logic level, e.g., reset data, in the nonvolatile memory cell MC, a reset pulse is supplied to the write global bit lines WGBL0 to WGBLn, a phase change material included in the nonvolatile memory cell MC is heated to a temperature above a melting temperature (Tm) and is then rapidly cooled to become an amorphous state. Similarly, to write data of a second logic level, e.g., set data, in the nonvolatile memory cell MC, a set pulse is supplied to the write global bit lines WGBL0 to WGBLn, a phase change material included in the nonvolatile memory cell MC is heated to a temperature below a crystallization temperature (Tx) and below the melting temperature (Tm), and the temperature is then maintained for a given period of time, and cooled so that the phase change material becomes an amorphous state.

In FIG. 6, for the sake of descriptive simplicity, one current path is formed throughout the nonvolatile memory cell MC selected from the write global bit lines WGBL0 to WGBLn, but the present inventive concept is not limited thereto. For example, in a nonvolatile memory device according to an exemplary embodiment of the present inventive concept, the nonvolatile memory cell MC is selectively coupled to the write global bit lines WGBL0 to WGBLn by at least two write local bit line selection circuits, so that at least two current paths may be formed throughout the nonvolatile memory cell MC selected from the write global bit lines WGBL0 to WGBLn. Meanwhile, to read data from the second memory bank (e.g., 110_8), a read pulse is supplied to the nonvolatile memory cell MC and a voltage level change occurring in the read global bit lines RGBL0 to RGBLn based on the read current is used.

In detail, a read current is supplied from the read circuit 220 to the nonvolatile memory cell MC, and a voltage level change occurring in the read global bit lines RGBL0 to RGBLn is sensed by the sense amplifier of the read circuit 220 to then read the data stored in the nonvolatile memory cell MC. When data is read from the memory banks 110_1 to 110_8 through the read global bit lines RGBL0 to RGBLn while writing data in the memory banks 110_1 to 110_8 through the write global bit lines WGBL0 to WGBLn, during a read while write operation, an error may be caused by a parasitic capacitance Cp between each of the write global bit lines WGBL0 to WGBLn and each the read global bit lines RGBL0 to RGBLn. In particular, during a read operation in which read cycles relatively shorter than write cycles are repeated, the read global bit lines RGBL0 to RGBLn are affected by a voltage level change occurring in the write global bit lines WGBL0 to WGBLn due to the parasitic capacitance Cp, thereby resulting in an error in the read operation. In detail, the write global bit lines WGBL0 to WGBLn are discharged and if levels of the write global bit lines WGBL0 to WGBLn are rapidly lowered, levels of the read global bit lines RGBL0 to RGBLn are also lowered by the effect of the parasitic capacitance Cp, so that data different from that stored in the nonvolatile memory device may be read.

In the nonvolatile memory device according to an exemplary embodiment of the present inventive concept, as shown in FIG. 1, since the respective write global bit lines WGBL0 to WGBLn and the respective read global bit lines RGBL0 to RGBLn are spaced apart from each other, rather than being alternately arranged, the error caused by the parasitic capacitance Cp between each of the write global bit lines WGBL0 to WGBLn and each of the read global bit lines RGBL0 to RGBLn can be prevented during the write operation and/or the read operation.

In addition, in the nonvolatile memory device according to an exemplary embodiment of the present inventive concept, since the ground line GNDL is disposed between the plurality of write global bit lines WGBL0 to WGBLn and the plurality of read global bit lines RGBL0 to RGBLn, the error caused by the parasitic capacitance Cp between each of the write global bit lines WGBL0 to WGBLn and each of the read global bit lines RGBL0 to RGBLn can be further prevented during the write operation and/or the read operation. In other words, since a relatively small voltage level change occurs in the ground line GNDL coupled to the ground power supply compared to that in the write global bit lines WGBL0 to WGBLn and the read global bit lines RGBL0 to RGBLn, the error caused by the parasitic capacitance Cp between each of the write global bit lines WGBL0 to WGBLn and each of the read global bit lines RGBL0 to RGBLn can be further prevented during the write operation and/or the read operation.

In the nonvolatile memory device according to an exemplary embodiment of the present inventive concept, at least one dummy global bit line DGBL is arranged between the ground line GNDL and the plurality of read global bit lines RGBL0 to RGBLn, thereby further preventing the error caused by the parasitic capacitance Cp between each of the write global bit lines WGBL0 to WGBLn and each of the read global bit lines RGBL0 to RGBLn during the write and read operations. In other words, the dummy global bit line DGBL is spaced apart from the write global bit lines WGBL0 to WGBLn and the read global bit lines RGBL0 to RGBLn, and the dummy global bit line DGBL is arranged between the ground line GNDL and the plurality of read global bit lines RGBL0 to RGBLn, thereby improving the performance of the write and read operations of the nonvolatile memory device according to an exemplary embodiment of the present inventive concept.

Further, the dummy global bit line DGBL can prevent the ground line GNDL from being affected during the read operation by the parasitic capacitance between the ground line GNDL and the read global bit lines RGBL0 to RGBLn, thereby improving the performance of the read operation. In detail, since the ground line GNDL is coupled to each of the write global bit lines WGBL0 to WGBLn and each of the read global bit lines RGBL0 to RGBLn through the first and second discharge blocks 151_1 and 153_1, as shown in FIG. 3, when the write global bit lines WGBL0 to WGBLn and/or the read global bit lines RGBL0 to RGBLn are discharged, the ground line GNDL being at the ground voltage level may temporarily increase to a predetermined voltage level. Accordingly, as the voltage level of the ground line GNDL changes, voltage levels of the write global bit lines WGBL0 to WGBLn and the read global bit lines RGBL0 to RGBLn may also change due to parasitic capacitances existing between the ground line GNDL and the write global lines WGBL0 to WGBLn, between the ground line GNDL and the read global bit lines RGBL0 to RGBLn and between each of the write global bit lines WGBL0 to WGBLn and each of the read global bit lines RGBL0 to RGBLn. For example, as shown in FIG. 5, when the ground line GNDL changes from the predetermined voltage level to the ground voltage level, the voltage levels of the read global bit lines RGBL0 to RGBLn are lowered by the predetermined voltage level ($\Delta V$) compared to a case when the ground line GNDL is at the ground voltage level, thereby generating an error during the read operation.

However, in the nonvolatile memory device according to an exemplary embodiment of the present inventive concept, the dummy global bit line DGBL is arranged between the ground line GNDL and the plurality of read global bit lines RGBL0 to RGBLn, thereby reducing errors during the read operation due to the voltage level change in the ground line GNDL as described above, thus improving the performance in the read operation.

Further, when a dummy global bit line (not shown) is additionally disposed at one side of the read global bit line RGBLn, for example, voltage levels of global bit lines disposed at opposite sides of any one of the selected read global bit lines RGBL0 to RGBLn, specifically, the read global bit line and the dummy global bit line, are substantially the same, thereby enabling data to be read in a secure manner. Table 1 summarizes voltage level states of global bit lines disposed at opposite lines of the plurality of read global bit lines RGBL0 to RGBLn.

TABLE 1

|  | DGBL | RGBL0 | RGBL1 | RGBL2 | ... | RGBLn | DGBL (not shown) |
|---|---|---|---|---|---|---|---|
| case 1 | F | SEL | F | F | ... | F | F |
| case 2 | F | F | SEL | F | ... | F | F |
| ... | ... | ... | ... | ... | ... | ... | ... |
| case n | F | F | F | F | ... | SEL | F |

In Table 1, "F" denotes that each global bit line (specifically a read global bit line or a dummy global bit line) is disabled by a global bit line selection circuit to go into a floating state, and "SEL" denotes that each global bit line (specifically a read global bit line or a dummy global bit line) is enabled by a global bit line selection circuit to be selected.

As confirmed from Table 1, any one of the selected read global bit lines RGBL0 to RGBLn may go into a floating state if it is disposed at opposite sides of the selected global bit line (specifically a read global bit line or a dummy global bit line). Accordingly, whichever bit line is selected among the plurality of read global bit lines RGBL0 to RGBLn, the selected bit line may have the same surrounding conditions as the other unselected read global bit lines, thereby enabling data to be read data in a secure manner.

Figure 7:
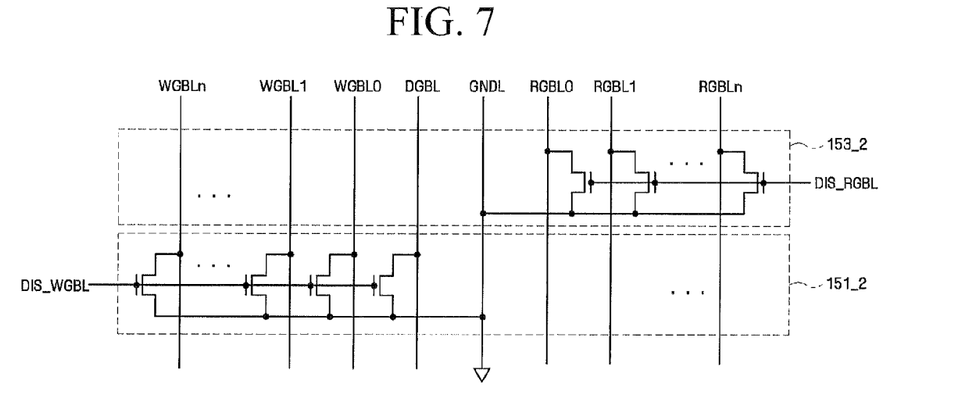
FIG. 7 is a layout diagram for explaining write global bit lines, a ground line, a dummy global bit line and read global bit lines in a nonvolatile memory device according to an exemplary embodiment of the present inventive concept.

FIG. 7 is a layout diagram for explaining write global bit lines, a ground line, a dummy global bit line and read global bit lines in a nonvolatile memory device according to an exemplary embodiment of the present inventive concept.

Referring to FIG. 7, the nonvolatile memory device according to an exemplary embodiment of the present inventive concept is substantially the same as the nonvolatile memory device according to an exemplary embodiment of the present inventive concept shown in FIG. 1, except that a dummy global bit line DGBL is disposed between a plurality of write global bit lines WGBL0 to WGBLn and a ground line GNDL.

In detail, in the nonvolatile memory device according to an exemplary embodiment of the present inventive concept, the plurality of write global bit lines WGBL0 to WGBLn, the dummy global bit line DGBL, the ground line GNDL and a plurality of read global bit lines RGBL0 to RGBLn may be sequentially arranged. In addition, the write global bit lines WGBL0 to WGBLn and the dummy global bit line DGBL may be coupled to the ground line GNDL through a first discharge block 151_2, while the read global bit lines RGBL0 to RGBLn may be coupled to the ground line GNDL through a second discharge block 153_2.

In other words, in the nonvolatile memory device according to an exemplary embodiment of the present inventive concept, the write global bit lines WGBL0 to WGBLn and the read global bit lines RGBL0 to RGBLn are spaced apart from each other by the dummy global bit line DGBL and the ground line GNDL. In addition, the write global bit lines WGBL0 to WGBLn may be spaced apart from the ground line GNDL by the dummy global bit line DGBL. Accordingly, the nonvolatile memory device according to an exemplary embodiment of the present inventive concept can prevent errors caused by the parasitic capacitance between each of the write global bit lines WGBL0 to WGBLn and each of the read global bit lines RGBL0 to RGBLn during the write operation and/or the read operation.

Further, the nonvolatile memory device according to an exemplary embodiment of the present inventive concept can prevent errors caused by the parasitic capacitance between the ground line GNDL and the write global bit lines WGBL0 to WGBLn during the write operation and/or the read operation. In other words, the performance of the nonvolatile memory device according to an exemplary embodiment of the present inventive concept can be improved during the write operation and/or the read operation.

Figure 8:
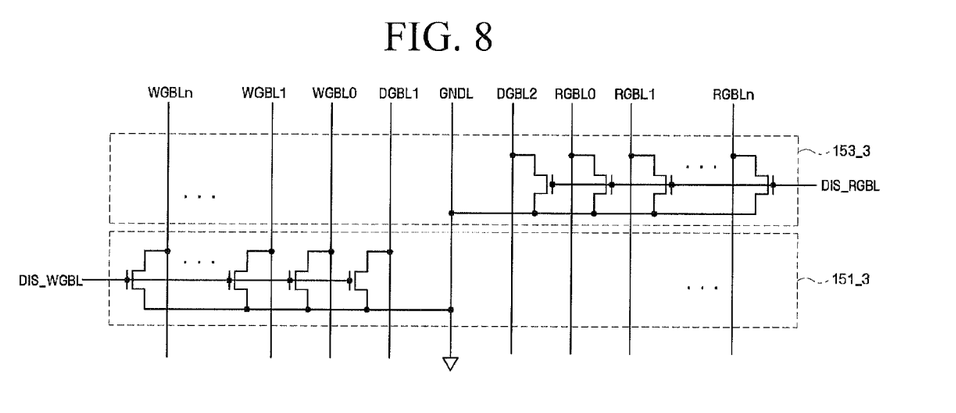
FIG. 8 is a layout diagram for explaining write global bit lines, a ground line, dummy global bit lines and read global bit lines in a nonvolatile memory device according to an exemplary embodiment of the present inventive concept.

FIG. 8 is a layout diagram for explaining write global bit lines, a ground line, dummy global bit lines and read global bit lines in a nonvolatile memory device according to an exemplary embodiment of the present inventive concept.

Referring to FIG. 8, the nonvolatile memory device according to an exemplary embodiment of the present inventive concept may be substantially the same as the nonvolatile memory device according to an exemplary embodiment of the present inventive concept shown in FIG. 1, except that a first dummy global bit line DGBL1 is disposed between a plurality of write global bit lines WGBL0 to WGBLn and a ground line GNDL and a second dummy global bit line DGBL2 is disposed between a plurality of read global bit lines RGBL0 to RGBLn and the ground line GNDL.

In detail, in the nonvolatile memory device according to an exemplary embodiment of the present inventive concept, the plurality of write global bit lines WGBL0 to WGBLn, the first dummy global bit line DGBL1, the ground line GNDL, the second dummy global bit line DGBL2 and the plurality of read global bit lines RGBL0 to RGBLn may be sequentially arranged. In addition, the write global bit lines WGBL0 to WGBLn and the first dummy global bit line DGBL1 may be coupled to the ground line GNDL through a first discharge block 151_3, while the read global bit lines RGBL0 to RGBLn may be coupled to the ground line GNDL through a second discharge block 153_3.

In other words, in the nonvolatile memory device according to an exemplary embodiment of the present inventive concept, as shown in FIG. 8, the write global bit lines WGBL0 to WGBLn and the read global bit lines RGBL0 to RGBLn are spaced apart from each other by the first and second dummy global bit lines DGBL1 and DGBL2 and the ground line GNDL. In addition, the write global bit lines WGBL0 to WGBLn and the read global bit lines RGBL0 to RGBLn may be spaced apart from the ground line GNDL by the first and second dummy global bit lines DGBL1 and DGBL2.

Accordingly, the nonvolatile memory device according to an exemplary embodiment of the present inventive concept can prevent errors caused by the parasitic capacitances between each of the write global bit lines WGBL0 to WGBLn and each of the read global bit lines RGBL0 to RGBLn during the write operation and/or the read operation, errors caused by the parasitic capacitance between the ground line GNDL and the write global bit lines WGBL0 to WGBLn during the write operation, and errors caused by the parasitic capacitance between the ground line GNDL and the read global bit lines RGBL0 to RGBLn during the read operation.

While the exemplary embodiment in FIG. 8 shows a plurality of write global bit lines and a plurality of read global bit lines spaced apart from each other, the present inventive concept is not limited thereto. In an exemplary embodiment of the present inventive concept, each of the plurality of write global bit lines and each of plurality of read global bit lines may be alternately arranged and a dummy global bit line may be arranged between each write global bit line and read global bit line pair.

Figure 9:
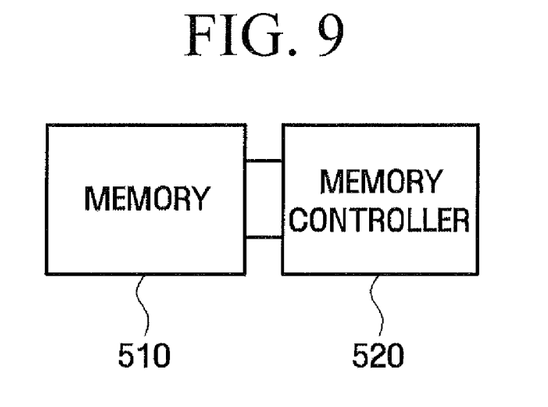
FIGS. 9 through 11 are block diagrams for explaining application examples of nonvolatile memory devices according to exemplary embodiments of the present inventive concept.
Figure 10:
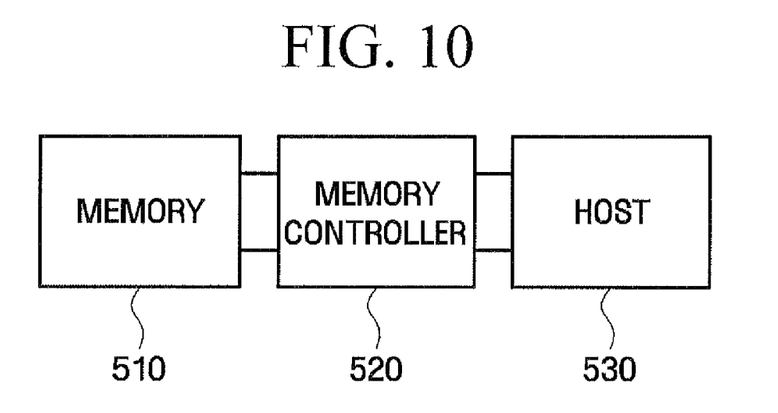
Figure 11:
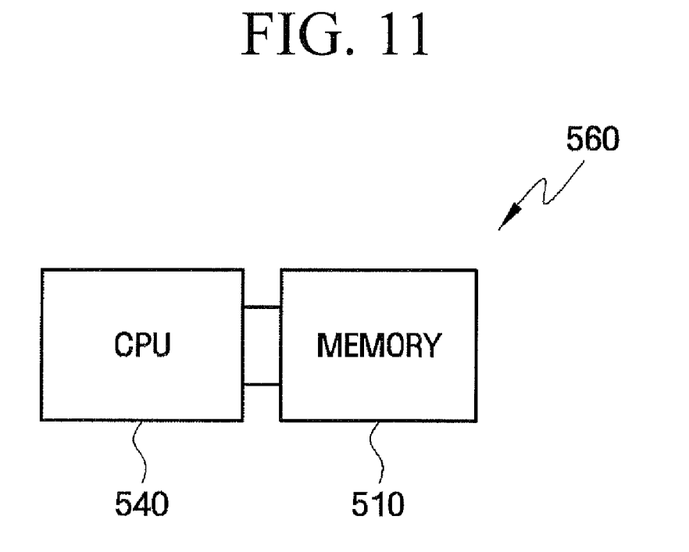

FIGS. 9 through 11 are block diagrams for explaining application examples of nonvolatile memory devices according to exemplary embodiments of the present inventive concept.

Referring to FIG. 9, a system according to an exemplary embodiment of the present inventive concept includes a memory 510 and a memory controller 520 connected to the memory 510. Here, the memory 510 may be, for example, any of the nonvolatile memory devices according to exemplary embodiments of the present inventive concept. The memory controller 520 may supply the memory 510 with input signals for controlling the operation of the memory 510, such as a command signal and an address signal for controlling read and write operations.

The system, including the memory 510 and the memory controller 520, may be embodied as a card such as a memory card. In detail, the system according to an exemplary embodiment of the present inventive concept may be used in the form of a card satisfying a predetermined industry standard, embodied as a mobile phone, a two-way communication system, a one-way pager, a two-way pager, a personal communication system, a portable computer, a personal data assistant (PDA), an audio and/or video player, a digital and/or video camera, a navigation system, or a global positioning system (GPS). However, the present inventive concept is not limited thereto and the system may be embodied in various other forms, including a memory stick, for example.

Referring to FIG. 10, a system according to an exemplary embodiment of the present inventive concept includes a memory 510, a memory controller 520 and a host 530. Here, the host 530 is connected to the memory controller 520 through a bus, for example, and supplies the memory controller 520 with a control signal to control the operations of the memory controller 520 and the memory 510. The host 530 may be a processing system embodied as, for example, a mobile phone, a two-way communication system, a one-way pager, a two-way pager, a personal communication system, a portable computer, a PDA, an audio and/or video player, a digital and/or video camera, a navigation system, or a GPS.

While FIG. 10 illustrates the memory controller 520 interposed between the memory 510 and the host 530, the present inventive concept is not limited thereto. In an exemplary embodiment of the present inventive concept, the memory controller 520 may not be provided.

Referring to FIG. 11, a system according to an exemplary embodiment of the present inventive concept may be a computer system 560 including, for example, central processing unit (CPU) 540 and a memory 510. In the computer system 560, the memory 510 is connected to the CPU 540 directly or through a general use computer bus architecture. The memory 510 may be used to store an operation system (OS) instruction set, a basic input/output start up (BIOS) instruction set, or an advanced configuration and power interface (ACPI) instruction set. Alternatively, the memory 510 may be used as a large-capacity storage device, such as a solid state disk (SSD).

For the sake of descriptive simplicity, all components of the computer system 560 are not illustrated in FIG. 11, but the present inventive concept is not limited thereto. In addition, for the sake of descriptive simplicity, the memory controller 520 is not illustrated between the memory 510 and the CPU 540. In an exemplary embodiment of the present inventive concept, the memory controller 520 may be provided between the memory 510 and the CPU 540.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A nonvolatile memory device, comprising:
   a plurality of memory banks, each including a plurality of nonvolatile memory cells;
   write global bit lines shared by the plurality of memory banks;
   read global bit lines shared by the plurality of memory banks; and
   a dummy global bit line arranged between the write global bit lines and the read global bit lines, wherein the dummy global bit line is configured and operable to reduce noise affecting a write global bit line involved in a write operation or noise affecting a read global bit line involved in a read operation.

2. The nonvolatile memory device of claim 1, further comprising a ground line shared by the plurality of memory banks and disposed between the write global bit lines and the dummy global bit line.

3. The nonvolatile memory device of claim 2, wherein the ground line is coupled to the write global bit lines through a first discharge block, and the read global bit lines and the dummy global bit line through a second discharge block.

4. The nonvolatile memory device of claim 3, wherein the dummy global bit line and the read global bit lines are simultaneously discharged through the ground line.

5. The nonvolatile memory device of claim 1, further comprising a ground line shared by the plurality of memory banks and disposed between the read global bit lines and the dummy global bit line.

6. The nonvolatile memory device of claim 5, wherein the ground line is coupled to the write global bit lines and the dummy global bit line through a first discharge block, and the read global bit lines through a second discharge block.

7. The nonvolatile memory device of claim 6, wherein the dummy global bit line and the write global bit lines are simultaneously discharged through the ground line.

8. The nonvolatile memory device of claim 1, wherein when a read global bit line is selected for reading, unselected read global bit lines and the dummy global bit lines go into a floating state.

9. The nonvolatile memory device of claim 1, wherein data is readable from a nonvolatile memory cell in a second memory bank through a first read global bit line, while data is being written in a nonvolatile memory cell in a first memory bank through a first write global bit line.

10. The nonvolatile memory device of claim 9, wherein the first write global bit line and the first read global bit line are selectively coupled to the same nonvolatile memory cell.

11. The nonvolatile memory device of claim 1, wherein the nonvolatile memory device further includes a ground line, and the ground line is disposed between the word global bit lines and the dummy global bit line.

12. The nonvolatile memory device of claim 1, wherein a nonvolatile memory cell comprises a phase change nonvolatile memory cell.

13. The nonvolatile memory device of claim 12, wherein the phase change nonvolatile memory cell comprises a diode controlled phase change random access memory cell.

14. The nonvolatile memory device of claim 1, wherein the nonvolatile memory device is connected to a memory controller, a host processing system or a central processing unit.

* * * * *